United States Patent
Kho (10) Patent No.: US 7,102,940 B2
(45) Date of Patent: Sep. 5, 2006

(54) CIRCUIT ARRANGEMENT FOR LATENCY REGULATION

(75) Inventor: Rex Kho, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/069,789

(22) Filed: Mar. 1, 2005

(65) Prior Publication Data

US 2005/0213417 A1    Sep. 29, 2005

(30) Foreign Application Priority Data

Mar. 1, 2004   (DE) .................. 10 2004 009 958

(51) Int. Cl.
*G11C 7/00*      (2006.01)
*G11C 8/00*      (2006.01)
(52) U.S. Cl. .................... 365/194; 365/233
(58) Field of Classification Search ............. 365/194, 365/233, 240
See application file for complete search history.

(56) References Cited

U.S. PATENT DOCUMENTS 5,796,673 A * 8/1998 Foss et al. ............. 365/233
5,978,284 A * 11/1999 Pawlowski ............. 365/194
6,128,248 A * 10/2000 Idei et al. .............. 365/233
6,262,938 B1 * 7/2001 Lee et al. .............. 365/233
6,327,217 B1 * 12/2001 Chung .................. 365/233
6,804,165 B1   10/2004 Schroegmeier

FOREIGN PATENT DOCUMENTS

DE    102 08 715 A1    9/2003

OTHER PUBLICATIONS

Ho-Jun Song et al., *A 200 MHz Register-Based Wave-Pipelined 64M Synchronous DRAM*, IEEE Journal of Solid-State Circuits, vol. 32, No. 1, Jan. 1997.

* cited by examiner

*Primary Examiner*—Anh Phung
(74) *Attorney, Agent, or Firm*—Patterson & Sheridan, L.L.P.

(57)  ABSTRACT

One embodiment of the invention relates to a circuit arrangement for regulating a latency that is defined as a whole number n of periods T of a reference clock of frequency $f_c$ and is intended to elapse, as of a data transmission command, before the data which are to be transmitted from a data source appear at the end of the data path that is to be passed through and contains a chain of transmission elements having fixed delay times. The frequency $f_c$ may be set in a range from $1/T_{max}$ to $1/T_{min}$, where $T_{min}$ is at least equal to $\tau_f/n$ and $\tau_f$ is equal to the sum of the fixed delay times in the data path. The data path is subdivided into n successive sections, each of which contains, at its input, a clock-controlled sampling element for accepting the data to be transmitted and has a propagation time that is considerably shorter than $T_{min}$. The propagation time $\tau_n$ of the last section (Sn) is considerably greater than zero. The clock of the sampling elements is controlled using a version of the reference clock that has been delayed by $T-\tau_n$.

20 Claims, 5 Drawing Sheets

CIRCUIT ARRANGEMENT FOR LATENCY REGULATION

CROSS-REFERENCE TO RELATED APPLICATIONS

This application claims foreign priority benefits under 35 U.S.C. §119 to co-pending German patent application number DE 10 2004 009 958.8-55, filed 1 Mar. 2004. This related patent application is herein incorporated by reference in its entirety.

BACKGROUND OF THE INVENTION

1. Field of the Invention

The invention relates generally to the clock-controlled transmission of data and relates especially to a circuit arrangement for regulating the data transmission latency. A preferred, but not exclusive, area of application of the invention is the transmission of memory information (which has been read), within a memory module, from the output buffer of a memory bank to the data output of the module.

2. Description of the Related Art

In data processing systems, a reference clock is normally used as a time standard to control the operations. Accordingly, the time markers which are set in a control device to coordinate the operating cycle are not defined as units of absolute time (for example micro- or nanoseconds) but rather as units of the reference clock, that is to say, as a number of clock periods. Variations in the clock frequency can thus be allowed without having to change the specifications of the control device. These specifications also include the stipulation of the so-called "latency" for the operation of transmitting data over a data path. This latency is prescribed as a whole number "n" clock periods which are intended to elapse, as of the time of a transmission command, before the data item to be transmitted appears at the end of the data path.

However, it must be taken into account that virtually every data path contains elements which, for physical reasons, give rise to an inevitable and essentially fixed "absolute" time delay (delay time) of the transmitted data. These include, for example, electrical components with inevitable response and transfer times (for instance, inverters and amplifiers) and delaying transmission lines. The sum "$\tau_f$" of these fixed absolute delay times in the data path determines the lower limit $n_{min}$ for selecting the latency n (defined above) for a given period duration T of the reference clock, since the product n*T must not be less than $\tau_f$.

$$\tau_f \leq n^*T \qquad \text{Eq. (1)}$$

If, in contrast, the latency n has been prescribed, the absolute time value $\tau_f$ determines the lower limit $T_{min}$ for the period duration T of the reference clock (and thus the upper limit $f_{cmax}=1/T_{min}$ for selecting the reference clock frequency $f_c$).

To comply with a desired latency n in an accurate manner, a period of time $\tau_g$ that is exactly the same as a whole number n of clock periods T of the clock frequency $f_c$ must elapse between a reference time $t_0$, at which the transmission of a data item (or of a burst of successive data) is requested, and the time $t_n$, at which the data item appears at the output end of the data path. The following requirement thus exists.

$$t_n - t_0 = T_g = n^*T \qquad \text{Eq. (2)}$$

Figure 1:
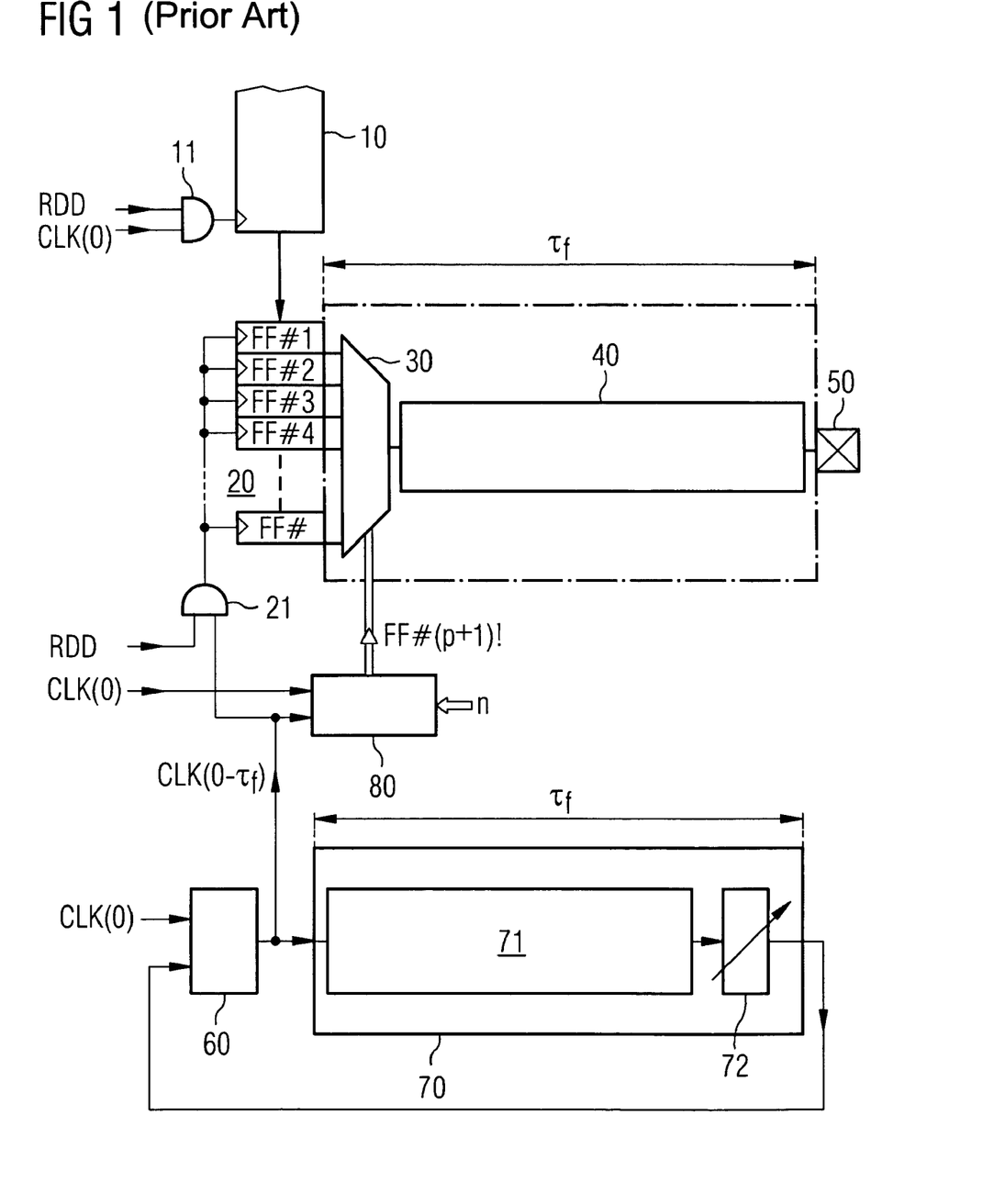
FIG. 1 shows the diagram of a circuit arrangement for latency regulation in accordance with the prior art.
Figure 2A:
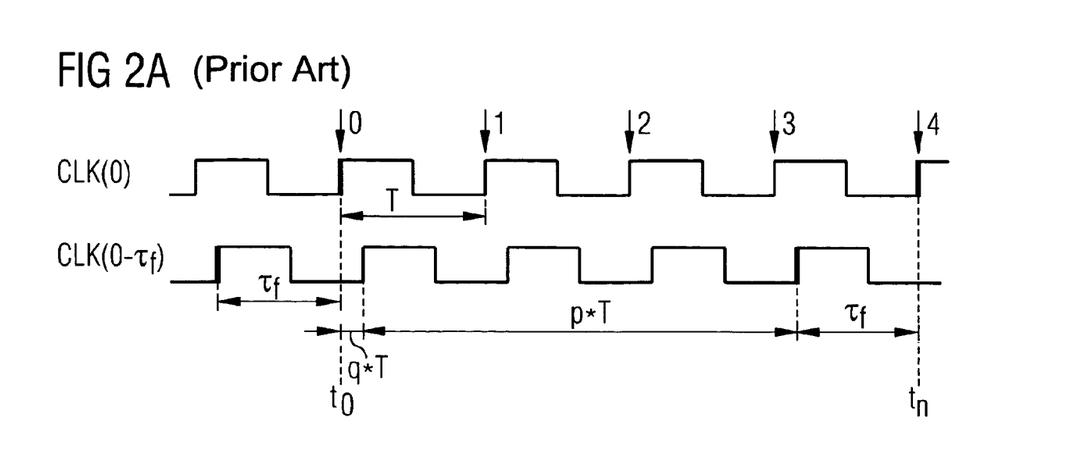
FIGS. 2A–C show timing diagrams for illustrating the method of operation of the circuit arrangement shown in FIG. 1 in respective cases of clock frequencies.
Figure 2B:
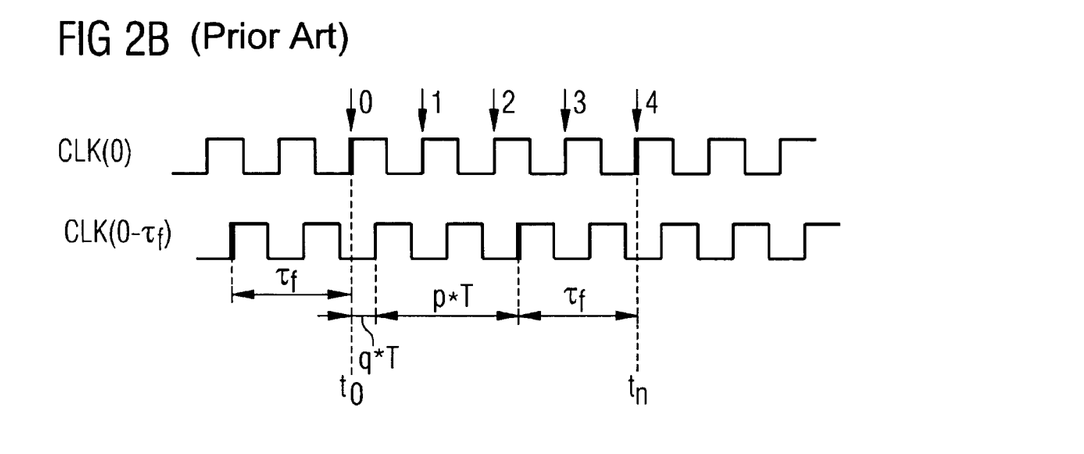
Figure 2C:
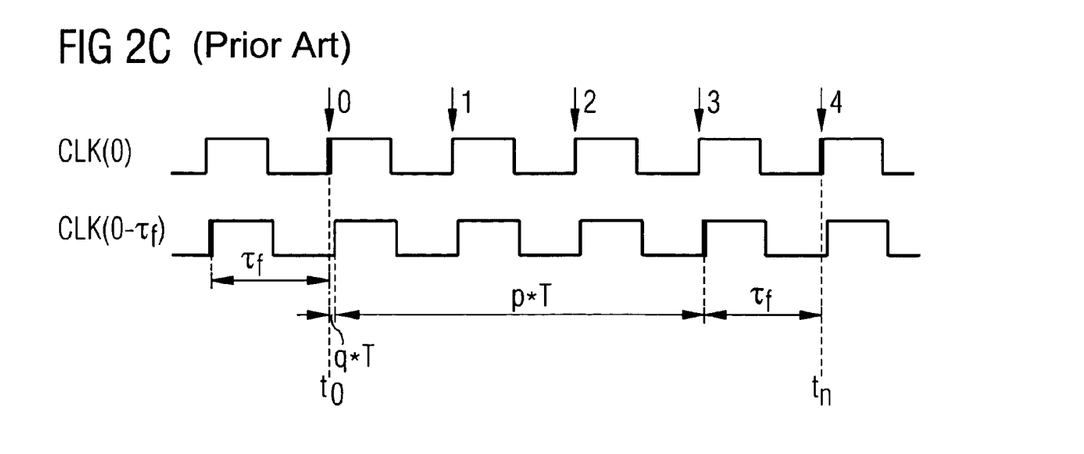

Of course, it cannot be assumed that the fixed delay time $\tau_f$ of the data path corresponds exactly to the product n*T. Rather, the delay time $\tau_f$ will be some fraction of n*T, which fraction changes with the value T (that is to say, in a manner dependent on the clock frequency $f_c$). It must therefore be ensured that the data experience an additional delay that is dependent on T to compensate for the difference between n*T and $\tau_f$. With reference to FIGS. 1 and 2, the text below shall first of all describe how this has hitherto been achieved in accordance with the prior art.

At the top left, FIG. 1 shows the source 10 of the data to be transmitted, which source is, for example, the data buffer at the data connections of a memory bank in a DRAM module that is integrated on a semiconductor chip. As is known, the acronym "DRAM" denotes a dynamic random access memory. In the read mode, the data which have been read from the respectively addressed memory cells are passed to this buffer 10 to be transmitted, on demand, from the output of the buffer to a contact piece 50. This contact piece (usually referred to as a "pad") is wired to an associated external data connection of the chip (not shown).

The pad 50 forms the end of a data path that begins at the output of the data source 10 and contains transmission elements which delay the data by a respective fixed time. In this example of data transmission from the read data buffer 10 of a memory bank to the pad 50, these transmission elements having a fixed delay time are, for example, various branches of a system of bus lines, elements of a data control logic unit for directing the data via selected branches of the bus system and, as the last element before the pad 50, a transmission driver (off-chip driver OCD) for amplifying the data before they are transmitted to the external data connection of the chip via the pad 50. Data amplifiers which respectively likewise give rise to a fixed delay may also be provided between individual branches or sections of the bus system. In addition to these elements (which are not shown individually in FIG. 1 but rather summarized in the form of a block 40), a multiplexer 30 that likewise causes a fixed delay and plays a special role in latency regulation, as will be described further below, is also provided in accordance with FIG. 1. All of these elements mentioned together give rise to the abovementioned fixed delay time $\tau_f$.

Depending on the value n selected and depending on the clock frequency $f_c=1/T$ used, the fixed delay time $\tau_f$ may be less than T or equal to T or greater than T. To bring the total delay $\tau_g$ from the data source 10 to the pad 50 precisely to the value n*T, the prior art introduces an additional delay that is composed of a first part p*T corresponding to an integer multiple p of the clock period T and of a second part q*T corresponding to a fraction q of the clock period T, in accordance with the following equations, $$p = INT(n - \tau_f/T) \geq 0 \qquad \text{Eq. (3)}$$

$$q = (n - \tau_f/T) - INT(n - \tau_f/T) \qquad \text{Eq. (4)}$$

where INT denotes the integer part of the argument placed in brackets after it.

The part p*T of the additional delay is introduced by inserting a suitable number of shift register stages at the start of the data path, said shift register stages being clock-controlled at the frequency $f_c$ of the reference clock. The part q*T of the additional delay is introduced by delaying the phase of the clock control of the shift register stages by an appropriate degree with respect to the reference clock.

In accordance with FIG. 1, the reference clock signal CLK(0) is used to derive a shifted version CLK(0-$\tau_f$) that has been time-shifted in the negative direction by precisely the fixed amount of time $\tau_f$ with respect to the original signal.

This is effected using a DLL ("delay locked loop") 60 whose feedback path contains a simulation 70 of the chain of all the elements (including the multiplexer 30) which together give rise to the fixed absolute delay $\tau_f$. The components of this simulation may be real copies of the relevant elements of the data path or may be equivalent circuits having an equivalent fixed delay time (for reasons of space, the latter is practiced, in particular, for the simulation of bus line lengths). Since inaccuracies (for example, variations from chip to chip) can occur when forming these copies or equivalent circuits, the components are, in practice, constructed in such a manner that they form a section 71 whose delay is definitely somewhat less than $\tau_f$ and which has an adjustable delay element 72 connected downstream to adjust the total delay precisely to the value $\tau_f$.

The integer part p of the difference between n and $\tau_f/T$ is ascertained, in a latency control logic unit 80, in accordance with Eq. (3) above by comparing the two clock signals CLK(0) and CLK(0–$\tau_f$) and taking into account the desired latency n.

In addition, the shifted reference clock signal CLK(0–$\tau_f$) is used to clock a shift register 20. This has the effect of the data along the shift register being clocked at the frequency $f_c=1/T$ of the reference clock but with a clock phase that effectively appears to be delayed by the fraction q (defined in Eq. (4)) of the clock period T with respect to the phase of the reference clock CLK(0).

The shift register 20 is shown in FIG. 1 in the form of a chain of successive D flip-flops (data flip-flops) FF#1, FF#2, etc. The input of the first stage FF#1 is directly connected to the output of the data source 10, and a tap is located at the output of each stage. The taps lead to the inputs of the multiplexer 30. In a manner dependent on the value p ascertained, the latency control logic unit 80 controls the multiplexer 30 in such a manner that the latter selects the (p+1)-th tap of the shift register 20 to insert the chain of the first to (p+1)-th stage of the register into the data path.

The data which have been transmitted thus experience a total delay of:

$$\tau_g = q*T + p*T + \tau_f \qquad \text{Eq. (5)}$$

If the values for p and q from Eq. (3) and Eq. (4) are inserted into Eq. (5), Eq. (2) above is arrived at exactly. The imposed requirement is thus satisfied.

The method of operation of the circuit arrangement shown in FIG. 1 will be explained in more detail below with reference to the timing diagrams (a) to (c) in FIG. 2, to be precise for three different clock frequencies $f_c$. All three diagrams (a) to (c) apply to the example n=4; that is to say, the period from the time $t_0$ of the transmission command to the time $t_n$ of the arrival of the first data item in a data burst (to be transmitted) at the pad 50 is intended to be exactly four clock periods. In each diagram, the reference clock signal CLK(0) and the shifted clock signal CLK(0–$\tau_f$) are shown on the same time axis. The rising edges of the clock signals shall be the "active" edges and respectively mark the beginning of a clock period of duration T=1/$f_c$. In the diagrams, these clock edges are marked on the reference clock signal CLK(0) with a respective small arrow and a serial number next to the arrow.

FIG. 2A illustrates the case in which the clock frequency $f_c$ has a value for which the fixed delay time $\tau_f$ of the data path is considerably shorter than one clock period T, namely 0.833 T. Accordingly, the DLL 60 (shown in FIG. 1) causes the clock signal CLK(0–$\tau_f$) to appear in a manner such that it has been shifted to the left by 0.833 T with respect to the reference clock signal CLK(0). The latency control logic unit 80 ascertains the integer value p=3 in accordance with Eq. (3) for n=4 and $\tau_f/T=0.833$ T. The logic unit 80 thus uses the multiplexer 30 to select the tap at the output of the fourth stage FF#4 of the shift register 20. The value 0.167 is obtained for the fraction q in accordance with Eq. (4).

The transmission command RDD is issued at the time to in synchronism with an edge of the reference clock CLK(0) and ensures that, as of this time, a connection is set up between the reference clock signal CLK(0) and a clock input of the data source 10, and a connection is set up between the shifted clock signal CLK(0–$\tau_f$) and the clock connections of the shift register 20. This is symbolized in FIG. 1 by an AND gate 11 in the clock supply line to the data source and an AND gate 21 in the clock supply line to the register 20. At the time to, the first data item reaches the input of the first register stage FF#1 and is transmitted to the output of this stage with the next active edge of the clock signal CLK(0–$\tau_f$). This edge appears a period of time q*T=0.167 T later than to. After a further p=3 clock periods, the data item appears at the "selected" tap at the output of the register stage FF#4 and then appears, after the further delay $\tau_f$, at the pad 50 at the time $t_n$. The total delay time desired thus results from $t_0$ to $t_n$:

$$\tau_g = 0.167T + 3*T + 0.833*T = 4*T.$$

FIG. 2B illustrates the case in which the clock frequency $f_c$ is twice as high as in the case of the diagram in FIG. 2A. The fixed delay time $\tau_f$ of the data path is now considerably longer than one clock period T, namely 1.666 T. Accordingly, the DLL 60 (in FIG. 1) causes the clock signal CLK(0–$\tau_f$) to appear in a manner such that it has been shifted to the left by 1.666 T with respect to the reference clock signal CLK(0). The latency control logic unit 80 ascertains the integer value p=2 in accordance with Eq. (3) for n=4 and $\tau_f/T=1.666$ T. The logic unit 80 thus uses the multiplexer 30 to select the tap at the output of the third stage FF#3 of the shift register 20. The value 0.333 is obtained for the fraction q in accordance with Eq. (4). In this case, too, the desired total delay time results, but in a different distribution:

$$\tau_g = 0.333T + 2*T + 1.666*T = 4*T.$$

The known circuit arrangement can be used to theoretically achieve a desired total delay time of exactly n*T given any desired values for T, n and $\tau_f$, provided that T*n is not less than $\tau_f$. However, one critical point in the known latency regulation method described is the latency control logic unit that ascertains the integer p in accordance with Eq. (3) above. This logic unit has decision-making problems when the quotient $\tau_f/T$ is equal to a whole number or comes very close to a whole number. Such a situation arises whenever the clock frequency $f_c$ has a value for which the clock period T=1/$f_c$ is equal to $\tau_f$ or an integer multiple thereof or comes very close to such values.

FIG. 2C illustrates this problem for the example of a frequency $f_c$ at which $\tau_f$ is only very slightly less than 1*T. In this case, the slightest instabilities in the clock frequency and/or in the elements of the latency control logic unit may cause $\tau_f/T$ to sometimes be assessed as being <1 and to sometimes be assessed as being >1. There is then the risk of the value of p that has been ascertained jumping in an undesired manner (between p=3 and p=2 in the case shown) which, for its part, leads to the latency temporarily jumping away from the desired value n. To reduce this risk, conventional latency control logic units contain complicated circuits to shift the supplied clock signals back and forth and thus incorporate hysteresis. However, practice has shown that, despite these measures, it has hitherto not been possible to completely eliminate the risk of latency jumps.

SUMMARY OF THE INVENTION

One aspect of the invention is to provide a circuit arrangement for latency regulation that reliably avoids undesired latency jumps.

Accordingly, one embodiment of the invention is implemented using a circuit arrangement for regulating a latency that is defined as a whole number n of periods T of a reference clock of frequency $f_c$ and is intended to elapse, as of a data transmission command, before the data which are to be transmitted from a data source appear at the end of the data path that is to be passed through. The circuit arrangement contains a chain of transmission elements having fixed delay times, making it possible to set the frequency $f_c$ in a range from $1/T_{max}$ to $1/T_{min}$, where $T_{min}$ is at least equal to $\tau_f/n$ and $\tau_f$ is the sum of the fixed delay times in the data path. One embodiment of the invention provides a device for subdividing the data path into n successive sections, each of which contains, at its input, a clock-controlled sampling element for accepting the data to be transmitted and has a propagation time that is considerably shorter than $T_{min}$, the propagation time $\tau_n$ of the last section also being considerably (or substantially) greater than zero. A device for controlling the clock of the sampling elements using a version of the reference clock that has been delayed by $T-\tau_n$ is also provided.

The wording "considerably/substantially greater than zero" that is used above and in the claims is to be understood in the sense that $\tau_n$ must always be sufficiently greater than zero such that it can be unambiguously measured and reproduced, that is to say, by an amount that is greater than the tolerance or variation range of the measurement and setting parameters.

During operation of the circuit arrangement according to one embodiment of the invention, the data require the whole number n-1 of clock periods T to pass through the first n-1 sections of the data path, because of the section-by-section clock control that forms a pipeline architecture. The propagation time $\tau_n$ in the last section remains as a non-integer fraction of T. Only the difference $T-\tau_n$ needs to be ascertained to delay the clock control by this amount so that the total delay is exactly n*T.

The circuit arrangement according to one embodiment of the invention thus never needs to make a critical decision as to the size of the integer part of clock periods T in a fixed delay time. Latency jumps which are based on wrong decisions do not occur. No complicated latency control logic unit, as in the prior art, is required.

A further advantage of the invention is that only the delay time $\tau_n$ of the last section, rather than the delay time of the entire data path, must be measured or simulated to set the clock control delay on the data path. This reduces the circuit complexity and also increases accuracy.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 3:
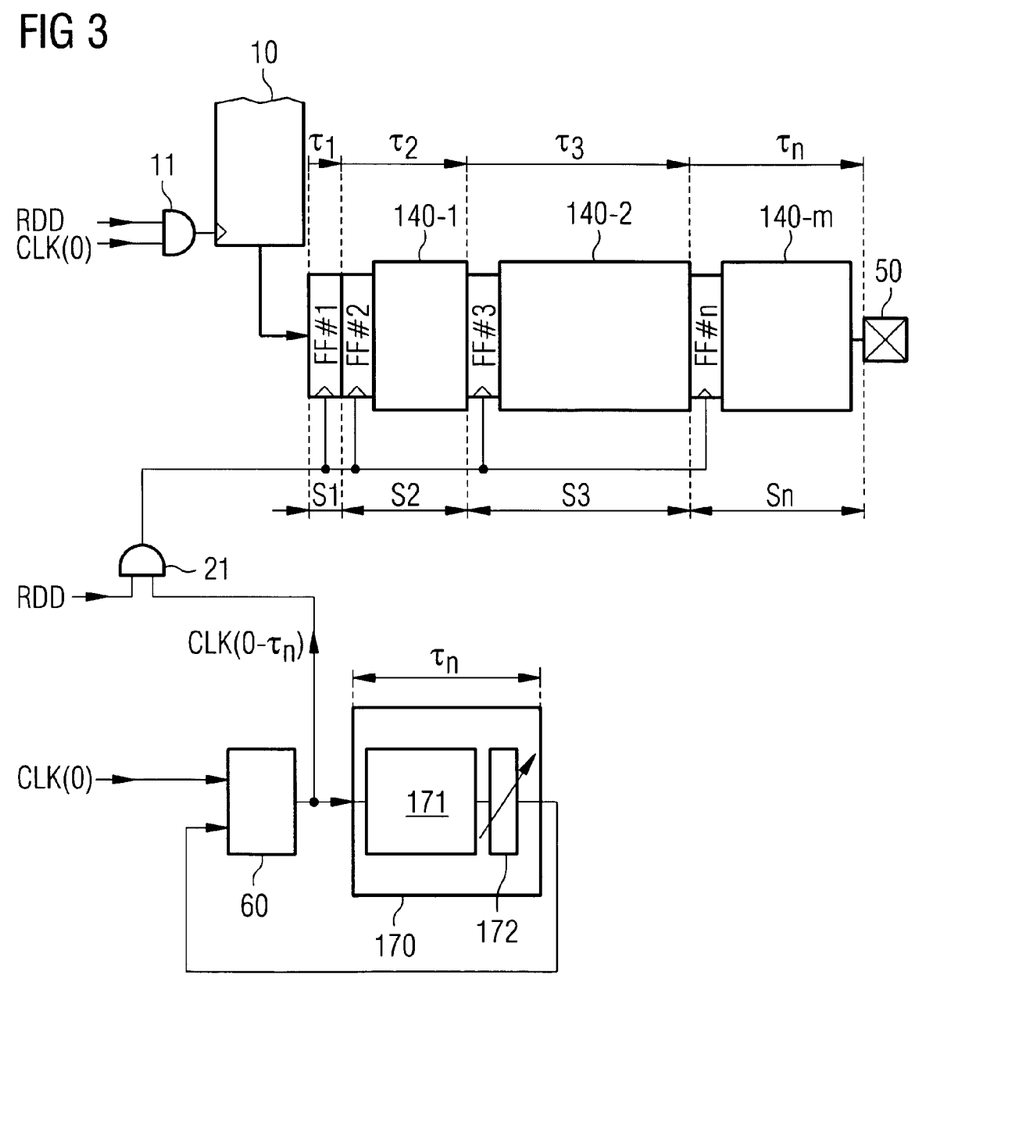
FIG. 3 shows the diagram of a circuit arrangement according to a first exemplary embodiment of the invention for regulating the latency to a fixed value n.

The exemplary embodiment shown in FIG. 3 is designed to regulate the latency n=4 (number of whole clock periods) of data transmission between a data source 10, which, in a similar manner to the case of FIG. 1, may be a read data buffer in a memory bank of a DRAM module, and a location 50, which, in a similar manner to the case of FIG. 1, may be a pad for an external data connection of the module. The data path from the data source 10 to the pad 50 is subdivided into n=4 successive sections S1 to Sn, each of which contains a clock-controlled data sampling element in the form of a D flip-flop. The symbols FF#1 to FF#n are used to designate these flip-flops, in accordance with the numbering of the sections S1 to Sn.

The data path also contains the chain of conventional transmission elements which delay the data by a respective fixed time. In said example of data transmission from a read data buffer 10 to a pad 50, these transmission elements are, for example, the abovementioned bus line sections, amplifiers, etc., which together give rise to the abovementioned fixed delay time $\tau_f$. The chain, which forms a cohesive structure in the prior art shown in FIG. 1, is subdivided, in the arrangement according to one embodiment of the invention, into a plurality m of sub-blocks 140-1, 140-2, ..., 140-m in m different sections of the data path.

The positions of the flip-flops FF#1 ... FF#n along the data path are selected in such a manner that the following conditions are satisfied:

(1) each of the sections S1 ... Sn begins with a flip-flop;
(2) the delay time of the data in each section is less than $T_{min}=1/f_{cmax}$, where $f_{cmax}$ is the highest clock frequency desired; and
(3) the last section Sn contains the last of the sub-blocks, with the result that the delay time $\tau_n$ of this section is considerably greater than zero.

The minimum number $m_{min}$ of sub-blocks 140 (that is to say, the minimum number of those sections which must contain parts of the transmission elements which delay in a fixed manner) depends on the values $T_{min}$ and $\tau_f$. Since each section also contains a flip-flop, the "transfer time" $\tau_{FF}$ of the respective associated flip-flop must also be included in the delay time of each of the sections S1 ... Sn. This transfer time is always considerably shorter than $T_{min}$. The following relationship thus applies.

$$m_{min}=INT(\tau_f/T_{min}+\tau_{FF})+1 \quad\quad\quad \text{Eq. (6)}$$

The actual number m of sub-blocks 140 may, of course, be greater than $m_{min}$ (however, at most equal to n). The number of sub-blocks and their respective length (delay time) may be selected as desired within said limits. If m is less than n, n-m sections of the data path are "empty" in the sense that they do not contain a sub-block of the transmission elements (which delay in a fixed manner) of the data path but rather only the respective associated flip-flop. The case of n=4 and m=3 is taken as a basis in the exemplary embodiment shown in FIG. 3. The positions of the flip-flops FF#1 . . . FF#n along the data path are selected, in accordance with FIG. 3, in such a manner that the m sub-blocks 140-1 to 140-m are located in the last m sections of the data path, and the first section S1 is therefore "empty".

According to one embodiment of the invention, the flip-flops FF#1 . . . FF#n in the data path are controlled, in accordance with FIG. 3, using a clock signal that has been delayed by $T-\tau_n$ with respect to the reference clock CLK(0), T being the period duration of the reference clock. The reference clock signal CLK(0) is used to derive a shifted version CLK($0-\tau_n$) that has been time-shifted in the negative direction by exactly the fixed amount of time $\tau_n$ with respect to the original signal. This maybe effected using a DLL 60 whose feedback path contains a simulation 170 of only the last section Sn of the data path. The components of this simulation may be real copies of the relevant elements of the data path or may be equivalent circuits having an equivalent fixed delay time (for reasons of space, the latter is typically practiced, in particular, for the simulation of bus line lengths). Since inaccuracies (for example, variations from chip to chip) can occur when forming these copies or equivalent circuits, the components are, in practice, constructed in such a manner that they form a section 171 whose delay is definitely somewhat less than Tn and which has an adjustable delay element 172 connected downstream of to adjust the total delay precisely to the value $\tau_n$.

The method of operation of the circuit arrangement shown in FIG. 3 will be explained in more detail below with reference to the timing diagrams in FIGS. 4A and 4B for two different clock frequencies $f_c$. In each diagram, the reference clock signal CLK(0) and the shifted clock signal CLK($0-\tau_n$) are shown on the same time axis. The rising edges of the clock signals shall be the "active" edges and respectively mark the beginning of a clock period of duration $T=1/f_c$. In the diagrams, these clock edges are marked on the reference clock signal CLK(0) with a respective small arrow and a serial number next to the arrow.

Figure 4A:
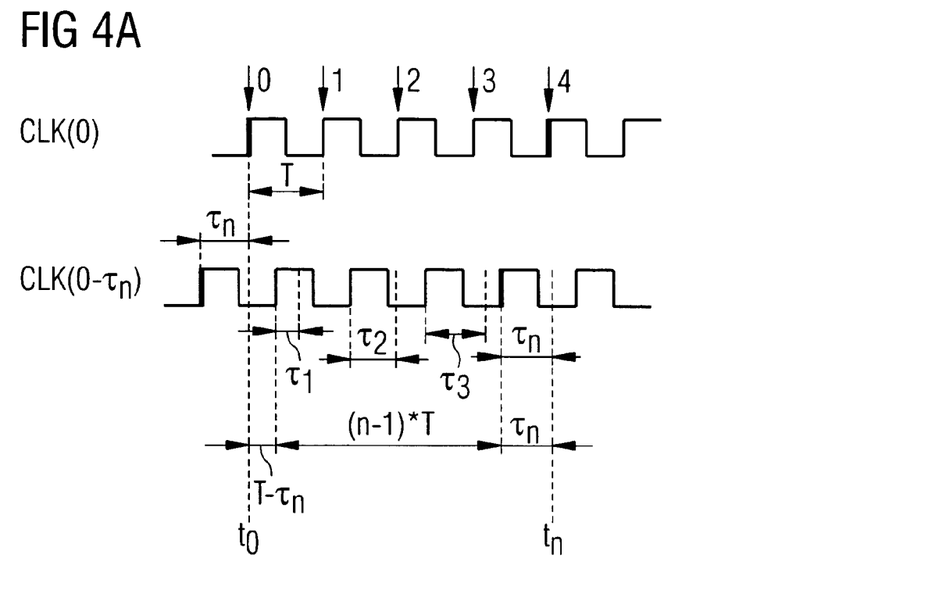
FIGS. 4A and 4B show timing diagrams for illustrating the method of operation of the circuit arrangement shown in FIG. 3 in the respective cases of clock frequencies.
Figure 4B:
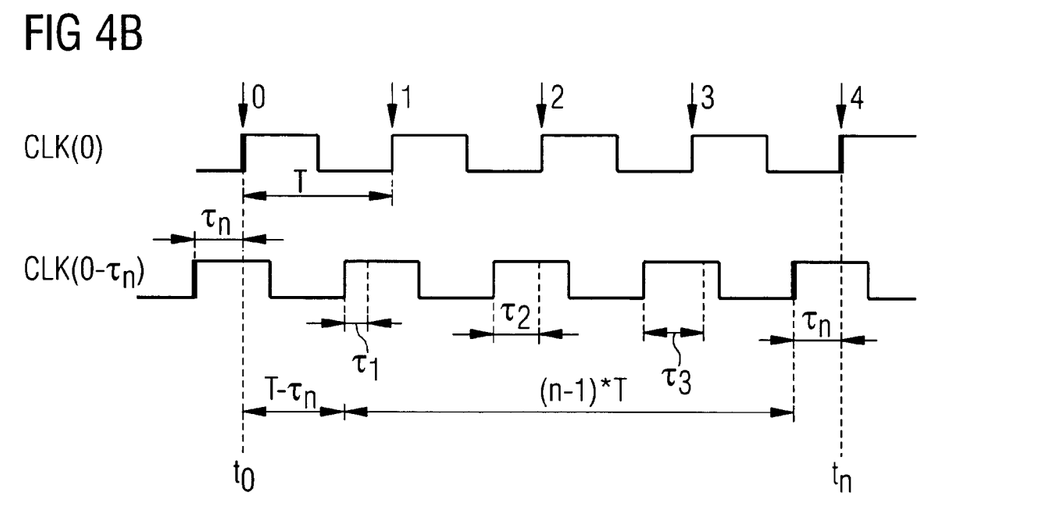

FIG. 4A illustrates the case in which the clock frequency $f_c$ has a relatively high value. FIG. 4B illustrates the case of a considerably lower (e.g., half as high) clock frequency. In both cases, the same pattern of events takes place:

The transmission command RDD is issued at the time to in synchronism with an edge of the reference clock CLK(0) and ensures that, as of this time, a connection is set up between the reference clock signal CLK(0) and a clock input of the data source 10 and that a connection is set up between the shifted clock signal CLK($0-\tau_n$) and the clock connections of the flip-flops FF#1 . . . FF#n. This is symbolized in FIG. 3 by an AND gate 11 in the clock supply line to the data source and an AND gate 21 in the clock supply line to the flip-flops. At the time $t_0$, the first data item reaches the input of the first flip-flop FF#1 and is transmitted, at the time $t_0+T-\tau_n$, to the first section S1 of the data path with the next active edge of the clock signal CLK($0-\tau_f$), which active edge appears a period of time ($T-\tau_n$) later. After a further delay by the period of time $\tau_1$ in the first section S1, the data item appears at the input of the second flip-flop FF#2. However, transmission to the second section is effected only with the next edge of the clock signal CLK($0-\tau_n$), that is to say, at the time $t_0+2T-\tau_n$. After a subsequent further delay by the period of time $T_2$ in the second section S2, the data item appears at the input of the third flip-flop FF#3. However, transmission to the third section S3 is effected only with the next edge of the clock signal CLK($0-\tau_n$), that is to say, at the time $t_0+3T-\tau_n$. After a subsequent further delay by the period of time T3 in the third section S3, the data item appears at the input of the last flip-flop FF#n. However, transmission to the last section Sn is effected only with the next edge of the clock signal CLK($0-\tau_n$), that is to say, at the time $t_0+n*T-\tau_n$. After a subsequent further delay by the period of time $\tau_n$ in the last section Sn, the data item appears at the pad 50 at the end of the data path at the time $t_n=t_0+n*T$.

The above described transmission corresponds precisely to the relationship required in accordance with Eq. (2) above. This transmission applies to any desired clock frequencies $f_c$, provided that none of the sections S1 . . . Sn has a delay time of longer than $1/f_c$. The desired result is achieved using considerably simpler means than in the prior art. There is no need for either a complex latency control logic unit for ascertaining the integer part of a numerical value or for a multiplexer for selecting shift register taps in a manner dependent on the integer part ascertained. There is thus no risk of latency jumps.

The requisite shifting of the clock signal to control the flip-flops can also be accurately achieved, in the circuit arrangement according to one embodiment of the invention, in a simpler manner than hitherto. It is necessary to only simulate the delay time of the last section rather than the entire data path. This not only requires less circuit complexity but can also be implemented in a more precise manner. Possible variations in the simulated delay time are, when regarded in absolute terms, far smaller, with the result that the adjustment means require a much smaller absolute dynamic range, thus improving the adjustment fineness.

In the exemplary embodiment shown in FIG. 3, the first section S1 of the data path is "empty" (that is to say, apart from the associated flip-flop, it does not contain any further components of the data path), while the sections S2, S3 and Sn of the data path have been "filled" (that is to say, in addition to the respective associated flip-flop, they contain other components of the data path). As was already indicated above, the data path may also be subdivided in another manner. The number m of filled sections can be made greater (up to, at most, equal to n) or smaller (at least equal to 2), provided that each of the sections has a delay time of less than $1/f_{cmax}$. The greater m is, the shorter the delay times of the filled sections may be made, and the higher $f_{cmax}$ may be selected.

Figure 5:
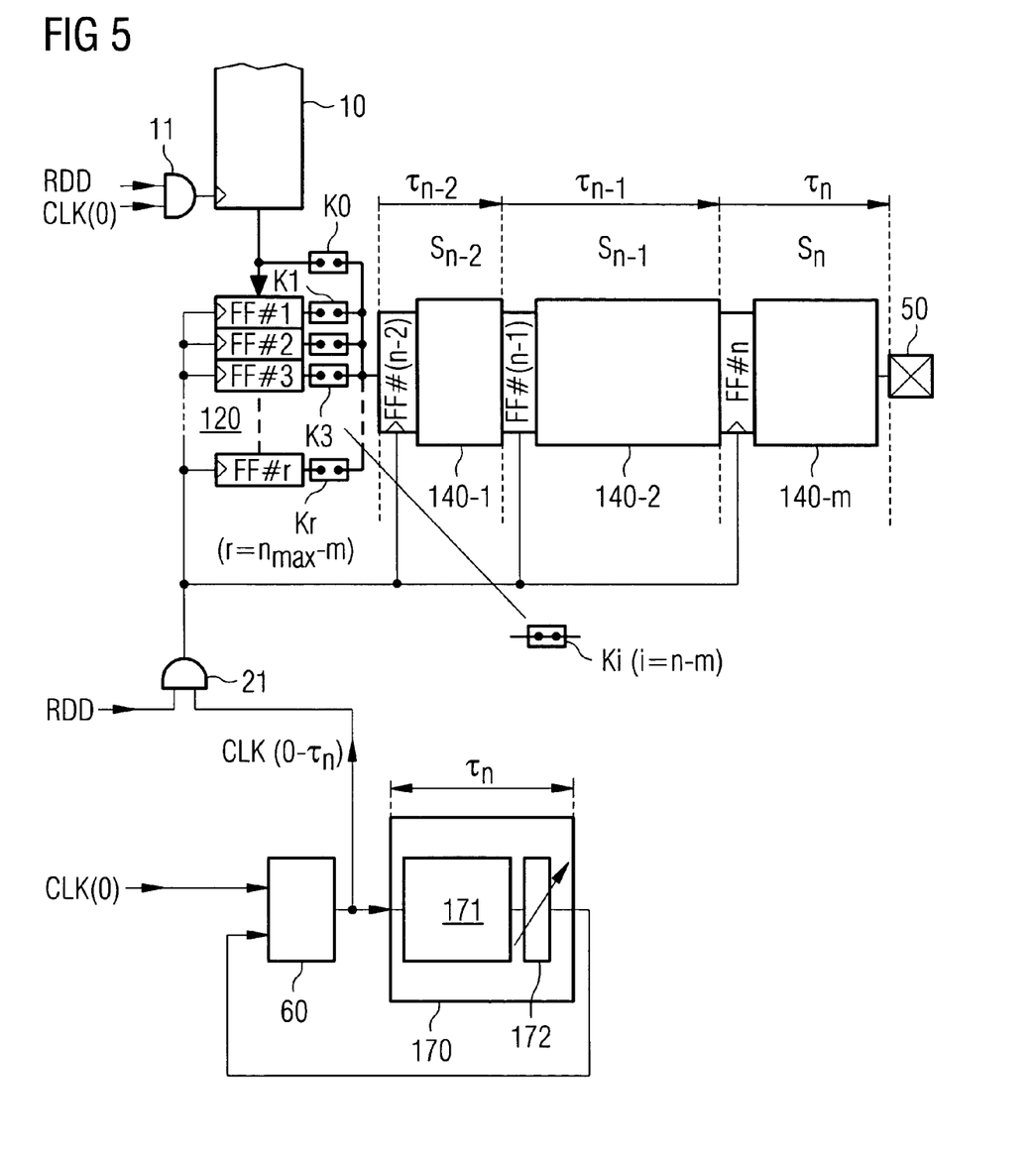
FIG. 5 shows the diagram of a circuit arrangement according to a second exemplary embodiment of the invention for regulating the latency to selectable values n.

The empty sections, if required (that is to say, in the case of m<n), can be inserted at any desired places on the data path before the last section. If, however, one or more of the empty sections or all of the empty sections are positioned at the start of the data path, this advantageously makes it possible to vary the latency value n in a very simple manner. This shall be explained in more detail below using an exemplary embodiment and with reference to FIG. 5:

In the example shown in FIG. 5, the number m of "filled" sections of the data path between the data source 10 and the pad 50 is equal to three (3). These sections are the last three sections Sn-2, Sn-1, Sn of the data path and correspond, in the case shown, to the three last sections S2, S3, Sn of the arrangement shown in FIG. 3. The arrangement shown in FIG. 5 differs from the arrangement shown in FIG. 3 only in that means are provided to insert a selectable number of empty sections into the data path upstream of the m filled sections to set the latency n within a range of values from m to any desired maximum $n_{max}$.

For this purpose, in accordance with FIG. 5, the output of the data source 10 is connected to the input of a chain of data flip-flops FF#1 . . . FF#r which form an r-stage shift register 120 that is clock-controlled using the shifted clock signal CLK(0–$\tau_n$). Provided at the input of the first stage FF#1 and at the output of each stage FF#1 . . . FF#r is a respective tap that can be selectively connected to the input of the first filled data path section (the section Sn-2 in the case of m=3 shown) by closing (that is to say, turning on) a respective associated switching path. The switching paths are designated K0 (for the tap at the input of the first register stage FF#1) and also K1 to Kr (for the taps at the outputs of the stages FF#1 . . . FF#r). The number r of stages is equal to $n_{max}$–m.

To set the latency to a desired value n, precisely that switching path Ki (of the switching paths K0 . . . Kr), whose ordinal number i within the sequence 0 . . . r is equal to n–m, is closed. If m=3 and n is supposed to be equal to 4, the switching path K1 is closed, so that only the first flip-flop FF#1 is inserted as an empty data path section. This then results in effectively the same circuit as shown in FIG. 3. If n is supposed to be equal to 3, the switching path K0 is closed, so that no additional section is inserted and the data path contains only the three filled sections Sn-2, Sn-1, Sn. If n is supposed to be equal to 6, the switching path K3 is closed, so that the chain of three register stage flip-flops FF#1, FF#2, FF#3 is inserted as three empty sections. In a similar manner, any desired value from m to $n_{max}$ can be set for the latency n.

The switching paths K0 . . . Kr may be implemented using any desired switching elements, for example, using fusible links (e.g., fuse elements) which can be "blown" electrically or by means of lasers or using open contact links which can be closed by means of metallization. Electronic switching devices, for example, a multiplexer that can be controlled using a suitable switching signal, may also be utilized to select the respective desired tap of the register 120. The electronic switching devices may be advantageous when it is not desired to permanently retain the selected latency setting. The delay time of the data in the switching device must not, however, be longer than $1/f_{cmax}$ minus the flip-flop transfer time $\tau_{FF}$ because, otherwise, the condition that none of the sections of the data path should have a delay time of less than $1/f_{cmax}$ is not satisfied.

In the figures, the data-carrying connecting lines are depicted as thick lines. The latter are intended to be used to indicate that these lines can be multicore to transmit a multibit data stream in parallel form. For this case, each element shown in the data path and at the ends of the data path mayt be considered to be a parallel circuit of a plurality of identical elements.

FIGS. 3 and 5 are diagrammatic illustrations in which, in terms of the drawing, all of the delay times which occur have been "gathered together" in discrete blocks, while the connecting lines for data and clock signals are to be regarded as being free of delays. In practice, delay time differences in the feed lines for the clock signals may be avoided by designing all of the clock lines to be of the same length from the respective clock source to the clock-controlled elements, for example, by means of branching using so-called "H-trees".

Whereas the preferred area of application of the invention is regulating the latency of the read data paths in memory modules (in particular in DRAMs), applications of latency regulation in other fields or in other data processing devices are also within the scope of the invention.

While the foregoing is directed to embodiments of the present invention, other and further embodiments of the invention may be devised without departing from the basic scope thereof, and the scope thereof is determined by the claims that follow.

What is claimed is:

1. A circuit arrangement for regulating latency in a data path, comprising:
   a device having n successive sections which subdivides the data path, each section containing, at its respective input, a clock-controlled sampling element for accepting data to be transmitted, each section having a propagation time that is shorter than $T_{min}$, wherein $T_{min}$ is at least equal to a sum of the fixed delay times in the data path divided by n and wherein a propagation time $\tau_n$ of a last section is greater than zero; and
   a delay device for controlling a clock for the sampling elements utilizing a version of a reference clock delayed by T–$\tau_n$.

2. The circuit arrangement of claim 1, wherein an input of a chain of a plurality of sampling elements is connected to an output of a data source, wherein the sampling elements are connected as a multistage shift register and are connected, for their clock control, to the version of the reference clock that has been delayed by T–$\tau_n$.

3. The circuit arrangement of claim 2, further comprising, a switching device configured to insert a selectable number of first stages of the multistage shift register into the data path.

4. The circuit arrangement of claim 1, wherein the sampling elements comprise data flip-flops.

5. The circuit arrangement of claim 4, wherein an input of a chain of a plurality of sampling elements is connected to an output of a data source and wherein the sampling elements are connected as a multistage shift register.

6. The circuit arrangement of claim 5, wherein the sampling elements are connected, for their clock control, to the version of the reference clock delayed by T–$\tau_n$.

7. The circuit arrangement of claim 6, further comprising a plurality of switching devices connected to insert a selectable number shift register into the data path.

8. The circuit arrangement of claim 1, wherein the propagation time $\tau_n$ of the last section is greater than a tolerance/variation range of a measurement parameter.

9. The circuit arrangement of claim 1, wherein the latency is defined as a whole number n of periods T of the reference clock of frequency $f_c$ which elapse, as of a data transmission command, before the data which are to be transmitted from a data source through a chain of transmission elements having fixed delay times.

10. The circuit arrangement of claim 1, wherein the data path transmits data read from a memory bank of a memory module to one or more contact pads for external data connections to the memory module.

11. A memory module, comprising:
   a memory bank;
   a data path for transmitting data read from the memory bank under clock control to one or more external data connections, wherein the data path includes a delay time; and
   a circuit arrangement for regulating latency in the data path, comprising:
      a plurality of successive sections which subdivides the data path, each section containing, at its respective input, a clock-controlled sampling element for accepting data to be transmitted, each section having a propagation time that is shorter than $T_{min}$, wherein $T_{min}$ is at least equal to a sum of the fixed delay times in the data path divided by a number n which equals a number of sections and wherein a propagation time $\tau_n$ of a last section is greater than zero; and a delay device for controlling a clock for the sampling elements utilizing a version of a reference clock delayed by $T-\tau_n$.

12. The memory module of claim 11, wherein an input of a chain of a plurality of sampling elements is connected to an output of a data source, and wherein the sampling elements are connected as a multistage shift register and are connected, for their clock control, to the version of the reference clock that has been delayed by $T-\tau_n$.

13. The memory module of claim 12, further comprising, a switching device configured to insert a selectable number of first stages of the multistage shift register into the data path.

14. The memory module of claim 11, wherein the sampling elements comprise data flip-flops.

15. The memory module of claim 14, wherein an input of a chain of a plurality of sampling elements is connected to an output of the memory bank and wherein the sampling elements are connected as a multistage shift register.

16. The memory module of claim 15, wherein the sampling elements are connected, for their clock control, to the version of the reference clock delayed by $T-\tau_n$.

17. The memory module of claim 16, further comprising a plurality of switching devices connected to insert a selectable number shift register into the data path.

18. The memory module of claim 11, wherein the propagation time $\tau_n$ of the last section is greater than a tolerance/variation range of a measurement parameter.

19. A method for regulating latency in a data path having a delay time, comprising:

dividing the data path into a plurality of successive sections, each section containing, at its respective input, a clock-controlled sampling element for accepting data to be transmitted, each section having a propagation time that is considerably shorter than $T_{min}$, wherein $T_{min}$ is at least equal to a sum of the fixed delay times in the data path divided by a number n which equals a number of sections and wherein a propagation time $\tau_n$ of a last section is considerably greater than zero; and controlling a clock for the sampling elements utilizing a version of a reference clock delayed by $T-\tau_n$.

20. The method of claim 19, further comprising:

selectively inserting one or more stages of a multistage shift register into the data path, wherein the multistage shift register is connected to an output of a data source.

* * * * *